United States Patent [19]

Ishikawa et al.

[11] Patent Number: 5,503,650
[45] Date of Patent: Apr. 2, 1996

[54] METHOD FOR PRODUCING A GLASS THIN FILM WITH CONTROLLOING AN OXIDE VAPOR OF AN ADDITIVE

[75] Inventors: Shinji Ishikawa; Akira Urano; Haruhiko Aikawa; Chizai Hirose; Hiroo Kanamori; Masahide Saitoh, all of Yokohama, Japan

[73] Assignee: Sumitomo Electric Industries, Ltd., Osaka, Japan

[21] Appl. No.: 330,602

[22] Filed: Oct. 28, 1994

Related U.S. Application Data

[63] Continuation of Ser. No. 33,786, Mar. 17, 1993, abandoned.

[30] Foreign Application Priority Data

Mar. 17, 1992 [JP] Japan .................................. 4-060439

[51] Int. Cl.[6] .................................................. C03B 37/018
[52] U.S. Cl. ............................... 65/384; 65/386; 65/430; 65/17.4; 65/60.5; 65/60.8
[58] Field of Search ................................. 65/60.5, 60.8, 65/17.4, 384, 399, 423, 430, 386

[56] References Cited

U.S. PATENT DOCUMENTS

| | | | |
|---|---|---|---|
| 3,653,862 | 4/1972 | Lynch | 65/60.5 |
| 3,801,294 | 4/1974 | Schultz | 65/18.2 |
| 3,954,431 | 5/1970 | Fleming | 65/18.2 |
| 4,597,787 | 7/1986 | Jacobson | 65/399 |
| 4,642,129 | 2/1987 | Douklias | 65/18.2 |
| 4,787,927 | 11/1988 | Mears | 65/18.2 |
| 4,799,946 | 1/1989 | Ainslie | 65/399 |
| 5,039,325 | 8/1991 | Miller | 65/18.2 |

FOREIGN PATENT DOCUMENTS

| | | |
|---|---|---|
| 111901 | 12/1983 | European Pat. Off. . |
| 58-125621 | 7/1983 | Japan . |
| 59-073443 | 4/1984 | Japan . |
| 60-231435 | 11/1985 | Japan . |
| 3150230 | 6/1991 | Japan .................................. 65/399 |
| 4260632 | 9/1992 | Japan .................................. 65/399 |
| 2066805 | 12/1980 | United Kingdom . |

OTHER PUBLICATIONS

Introduction to Ceramics, 2nd ed., Kingery et al., 1976, pp. 402–403, Wiley.

*Primary Examiner*—David A. Simmons
*Assistant Examiner*—John M. Hoffmann
*Attorney, Agent, or Firm*—Cushman Darby & Cushman

[57] ABSTRACT

A method of producing an oxide glass thin film includes a process to obtain a transparent glass film, in which volatilization of additives in a porous film deposited is effectively suppressed and which can provide an oxide glass thin film having a desired arrangement of refractive index with a low optical loss. The method is for producing an oxide glass thin film, in which glass fine particles mainly containing $SiO_2$ with additives are deposited on a substrate to form a porous thin film and then heated to form a transparent glass film. In the method, vapor of oxides of additive components is mixed in an atmosphere in which the porous thin film is heated to form the transparent glass film, whereby stopping the volatilization of the additives in the porous film deposited, preventing diffusion of the additives added to a core layer, and preventing the volatilization of glass transition temperature lowering components of additives ($P_2O_5$, $B_2O_3$, $GeO_2$, etc.). By these, a desired arrangement of refractive index may be obtained, and an oxide glass thin film may be obtained while lowering the optical loss such as the optical scattering, which could be caused by bubbles in an unsintered portion.

13 Claims, 8 Drawing Sheets

METHOD FOR PRODUCING A GLASS THIN FILM WITH CONTROLLOING AN OXIDE VAPOR OF AN ADDITIVE

This is a continuation of application Ser. No. 08/033,786, filed on Mar. 17, 1993, which was abandoned upon the filing hereof.

BACKGROUND OF THE INVENTION

1. Field of the Invention

The present invention relates to a method and an apparatus for producing an oxide glass thin film to be used for formation of optical waveguide or the like.

2. Related Background Art

A glass optical waveguide formed on a silica glass substrate or on a silicon substrate shows good matching with optical fibers, and, therefore, is used as a component for optical communication. There is a method for forming a glass optical waveguide on a substrate, in which fine particles of glass are deposited on a substrate by a gas phase method using an oxygen-hydrogen burner to form a porous glass thin film thereon (see FIG. 1) and the substrate is then heated at a high temperature by means of an electric oven to finally form a transparent glass thin film on the substrate. Normally, the substrate is a silicon wafer, and the waveguide as so formed contains a main component of $SiO_2$. In this case, the melting point of silicon is lower than the glass transition temperature of pure $SiO_2$. It is a usual practice to lower the glass transition temperature by adding an additive or additives such as $P_2O_5$, $B_2O_3$, $GeO_2$, and the like into $SiO_2$. The specific contents of the conventional example are described in detail for example in Japanese Laid-open (Kokai) Patent Application No. 58-105111, Japanese Laid-open (Kokai) Patent Application No. 1-192732, and U. S. Pat. No. 4,263,031.

In case that the fine particles of glass are deposited on the substrate to form the porous thin film and heated at the high temperature by the electric oven to form the transparent glass thin film, as described above, the following problems would occur by volatilization scattering of additive components added into the oxide glass thin film in order to lower the glass transition temperature.

Components easy to volatilize to scatter, such as $P_2O_5$, $B_2O_3$, etc., among the additive components first go out of the thin film, which raises the glass transition temperature of the glass portion from which the volatile components have been volatilized to scatter. The rise of the glass transition temperature results in leaving an unsintered portion or non-transparent glass portion behind in the glass film produced. This would cause a high optical loss in a waveguide thus formed from such a glass film. Additionally, the refractive index of the glass film surface varies depending upon the volatilization of the additive components, which makes it difficult to obtain a desired arrangement of refractive index. This in turn makes the design of waveguide structure difficult.

SUMMARY OF THE INVENTION

It is an object of the present invention, taking the above problems into account, to obtain an oxide glass thin film having a desired refractive index arrangement with a low optical loss by suppressing the volatilization of additives in a porous glass thin film deposited on a substrate during a step of changing the porous film into a transparent glass film.

Solving the above problems, the present invention involves a method for producing an oxide glass thin film, in which fine particles of glass mainly containing $SiO_2$ with an additive or additives are deposited on a substrate to form a porous thin film thereon and in which the porous thin film is heated to form a transparent glass film on the substrate, wherein vapor of oxide(s) of the additive component(s) is mixed in an atmosphere in which the porous thin film is heated to form the transparent glass film.

That is, a method for producing a glass thin film according to this invention comprises:

a first step of depositing fine particles of glass mainly containing $SiO_2$ with an additive on a substrate to form a porous glass thin film thereon; and a second step of heating the porous glass thin film to form a transparent glass thin film on the substrate; the second step being conducted in an atmosphere containing a vapor of an oxide of a component in the additive for suppressing a volatizaition of the additive in the fine particles.

There are following methods for introducing the vapor of the oxides into the atmosphere:

(a) A method in which each of vapor components ($P_2O_5$, $B_2O_3$, $GeO_2$, etc.) is heated to evaporate in a separate manner and then introduced into a heating area of substrate;

(b) A method in which vapor of chlorides ($PCl_3$, $POCl_3$, $BCl_3$, $GeCl_4$, etc.) is oxidized with $O_2$ gas and then introduced into the heating area of substrate.

According to the present invention, the heating area temperature of the vapor components in the method (a) or the oxidation area temperature in the method (b) is set at a temperature at which a vapor pressure of the introduced oxides is 50 to 150% of the equilibrium vapor pressure at the substrate heating area temperature.

The volatilization of the additives may be represented by the following chemical formula 1 or chemical formula 2.

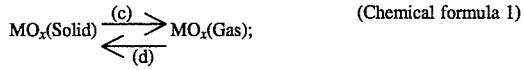

(Chemical formula 1)

(M: Metal ion)

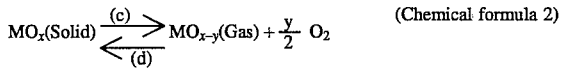

(Chemical formula 2)

The volatilization of the additive components occurs with progress of the rightward reactions in the above formulas. The volatilization reactions are determined by chemical equilibrium at a treatment temperature. Thus, if the volatile components should exist in the treatment gas at a vapor pressure over the equilibrium pressure at the substrate treating temperature, the reactions of the arrow (c) in chemical formula 1 and in chemical formula 2 would not proceed to cause no volatilization of the additive components. However, a practically sufficient effect can be obtained in actual process if the volatilizing components are between 50% and 150% of the equilibrium pressure at the substrate treating temperature.

Provided that the heating area temperature of the vapor components or the oxidation area temperature is kept at a higher temperature than the substrate heating area temperature, a vapor pressure of each additive component would become over the equilibrium vapor pressure of the chemical formula 1 or the chemical formula 2, thereby enhancing the effect of preventing the volatilization of the additive components as described.

Components easy to volatilize to scatter are $P_2O_5$, $B_2O_3$, and $GEO_2$, equilibrium vapor pressures of which are shown in FIG. 2.

According to the present invention as described above, in production of the oxide glass thin film to be used for formation of optical waveguides or the like, the vapor of volatile oxide components is introduced into the atmosphere in which the heating process to form the transparent glass film is carried out, so as to stop the volatilization of the additives in the porous film deposited, whereby preventing diffusion of the additives added into a core layer and also preventing the volatilization of glass transition temperature lowering components in the additives ($P_2O_5$, $B_2O_3$, $GeO_2$, etc.). By these, a desired arrangement of refractive index may be obtained, and an oxide glass thin film may be obtained while lowering the optical loss such as the optical scattering, which could be caused by bubbles in the unsintered portion.

The present invention will become more fully understood from the detailed description given hereinbelow and the accompanying drawings which are given by way of illustration only, and thus are not to be considered as limiting the present invention.

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art form this detailed description.

DESCRIPTION OF THE PREFERRED EMBODIMENTS

The preferred embodiments according to the present invention will be described in detail in the following.

Example 1

Figure 1:
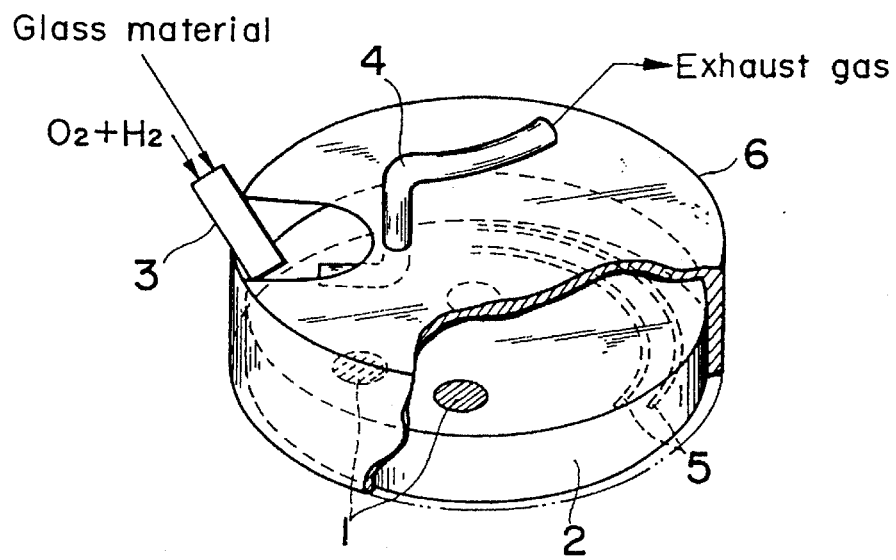
FIG. 1 is a schematic drawing to show an apparatus for depositing fine particles of glass on a substrate.
Figure 2:
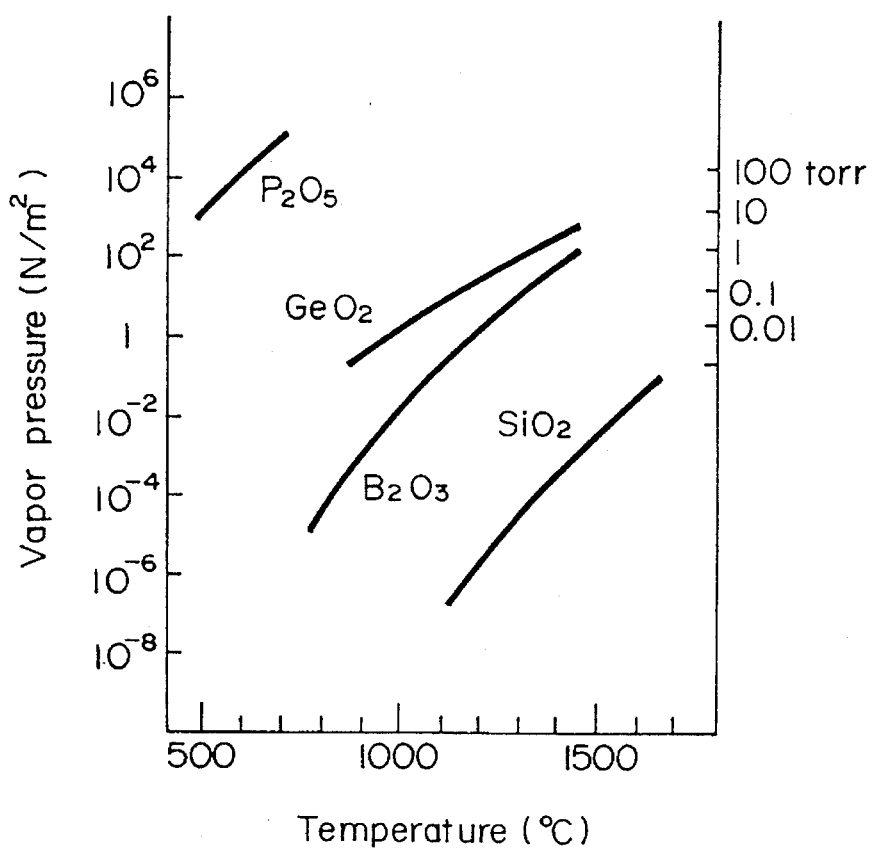
FIG. 2 is a drawing to show equilibrium vapor pressures of major additive components.

Using an apparatus as shown in FIG. 1, fine particles of glass mainly containing $SiO_2$ are deposited a substrate of Si to form a deposit film of the glass fine particles.

First explained is the apparatus for depositing the glass fine particles on the substrate as shown in FIG. 1. There are a plurality of substrates 1, onto which the glass fine particles through a torch 3 are to be deposited and which are disposed in a reaction vessel 6 having a bottom of a rotatable turn table 2. Glass fine particles which are not deposited on the substrates 1 and the exhaust gas are sucked through an exhaust pipe 4. The turn table 2 on which the substrates 1 are placed is driven to rotate relative to the reaction vessel 6 by means of a motor (not shown), and the torch 3 reciprocates in the radial direction of the turn table 2. Such an arrangement permits the glass fine particles to be uniformly deposited on the substrates 1. A lower heater 5 is provided on the turn table 2 to uniformly heat the substrates 1 placed on the turn table 2.

Using the above-described apparatus, fine particles of glass for optical waveguide film were deposited on substrates. Substrates 1 were arranged on the turn table 2, and the substrates 1 were heated by the lower heater 5 to increase the temperature thereof while turning the turn table 2. Then, $O_2$ gas and $H_2$ gas were supplied to the torch 3, and an oxygen-hydrogen flame was formed at a blow-off portion of the torch 3 toward the substrates 1. At the same time, the torch 3 was reciprocated in the radial direction of the turn table 2. After the substrate temperature reaches a predetermined temperature, a raw material of glass was fed to the torch 3 to undergo the hydrolysis in the flame, thereby depositing the glass fine particles on the substrates 1.

Conditions of the deposition of the glass fine particles were as follows: A rotation speed of the turn table 2 was 10 [rpm]; a moving speed of the torch 3 was 120 [mm/min]; a moving distance of the torch 3 was 200 [mm]; a feed rate of $O_2$ gas into the torch 3 was 8 [l/min]; a feed rate of $H_2$ gas into the torch 3 was 10 [l/min]. The glass raw material was supplied to the torch 3 under the following conditions.

First Deposition Conditions

Fine particles of glass for under cladding layer (deposition time: 30 min)

$SiCl_4$: 250 [cc/min];
$BCl_3$: 10 [cc/min];
$PCl_3$: 25 [cc/min].

Second Deposition Conditions

Fine particles of glass for core layer (deposition time: 20 min)

$SiCl_4$: 250 [cc/min];
$GeCl_4$: 40 [cc/min];
$PCl_3$: 20 [cc/min];
$BCl_3$: 5 [cc/min].

After that, the glass fine particles thus deposited on the substrate 1 were heated using a heating oven 10.

Figure 3:
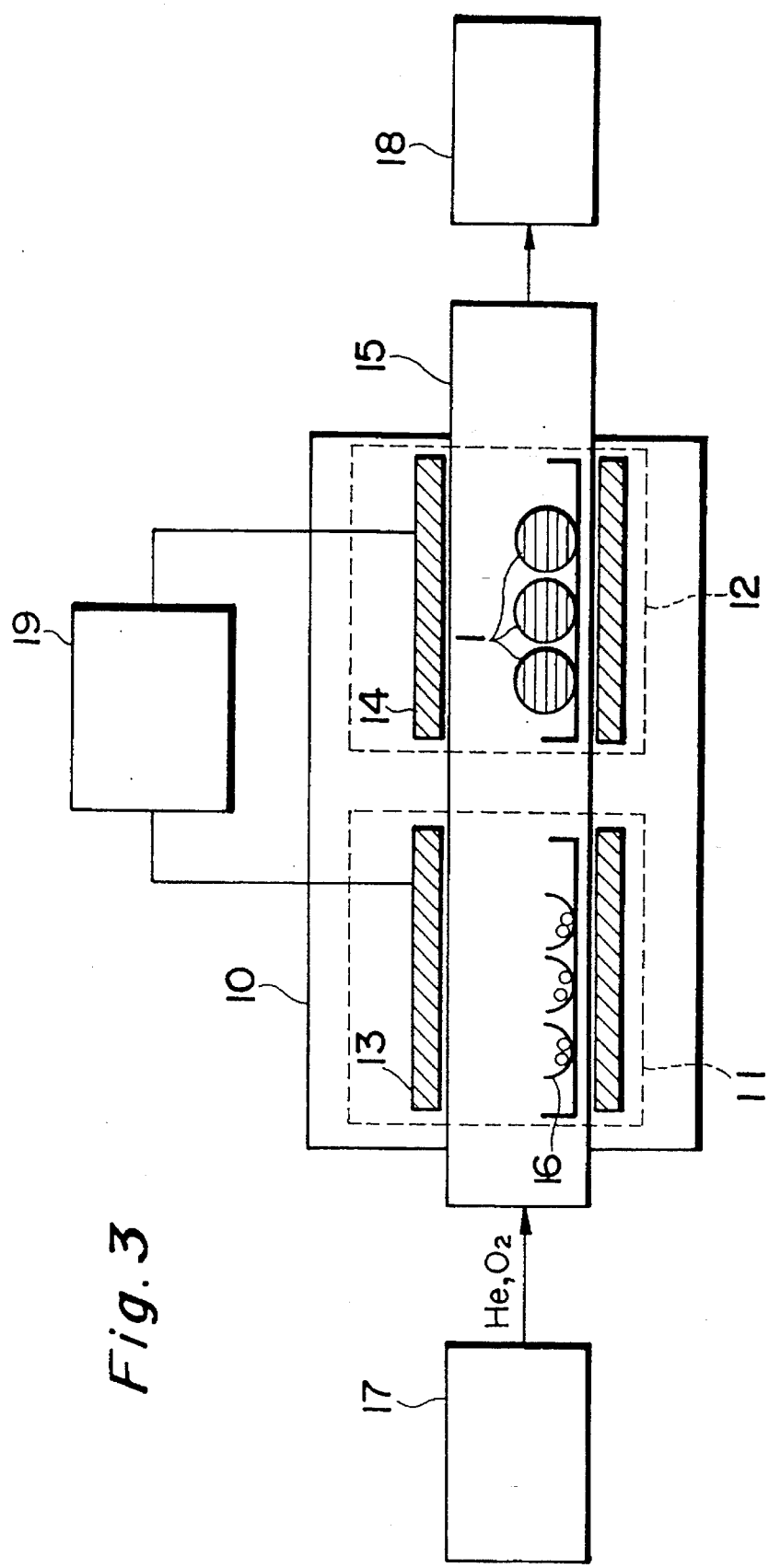
FIG. 3 is a schematic drawing to show an apparatus used in Example 1 according to the present invention.

FIG. 3 shows a schematic construction of an apparatus used in Example 1, which is explained in the following. A heating oven 10 is composed of an oven core tube 15, heaters 13, 14, a gas supplying unit 17 for supplying gas into the oven core tube 15, and a gas evacuating unit 18 for evacuating the gas out from the oven core tube 15. The oven core tube 15 is a spatially continuous tube. The oven core tube 15 has a heating area (i.e., a first chamber) 11 for heating vapor components, which is located on the upstream side of gas flow, and a heating area (i.e., a second chamber) 12 for heating the substrates, which is located on the downstream side. The two heating areas are independently controlled by a control unit 19 to have respective temperatures through the heaters 13, 14, as shown in FIG. 3.

Platinum crucibles 16 were situated in the heating area 11 of the vapor components, in which respective oxides of $P_2O_5$, $B_2O_3$, and $GeO_2$ were separately set, and were heated. The substrates 1 were placed in the heating area 12 of substrate.

Figure 4:
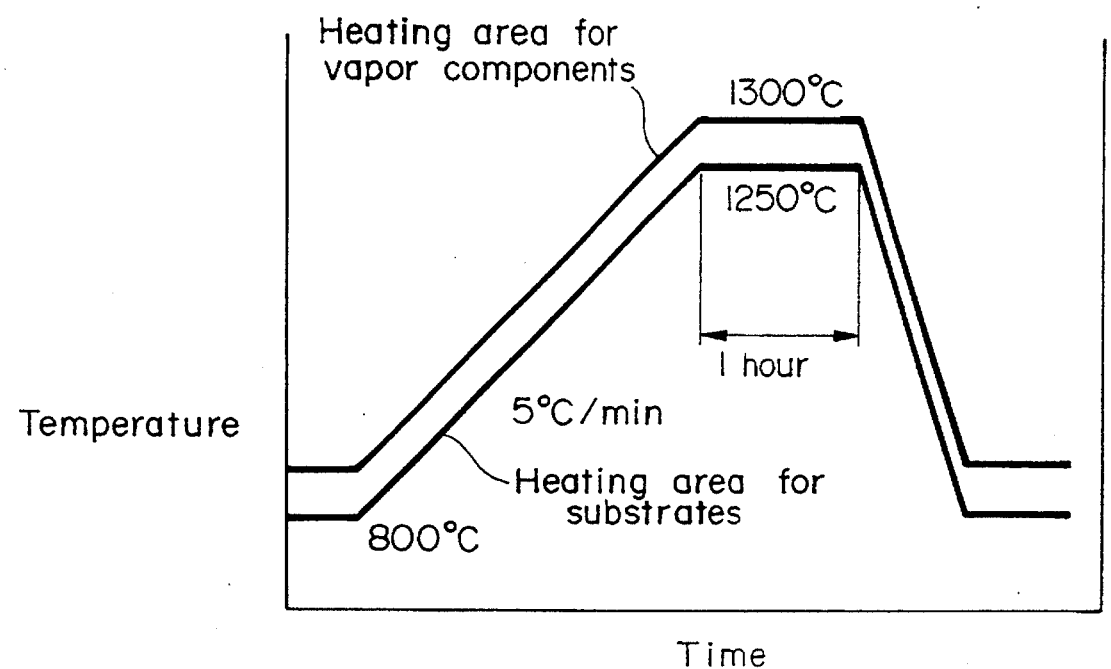
FIG. 4 is a schematic drawing to show a temperature control in Example 1 according to the present invention.

The vapor component heating area 11 was initially set at 850 [°C.] and the substrate heating area 12 at 800 [°C.], and mixture gas of $O_2$ at 5 [l/min] and He at 5 [l/min] was supplied to flow through the areas. The temperature was raised at a rate of temperature rise of 5 [°C./min], the vapor component heating area 11 and the substrate heating area 12 were then kept at 1300 [°C.] and at 1250 [°C.], respectively, for one hour, and then the temperature of the vapor component heating area 11 and the temperature of the substrate heating area 12 were decreased down to 850 [°C.] and to 800 [°C.], respectively, as shown in FIG. 4. After stopping the supply of the mixture gas, the substrates 1 were taken out. In this heating process, the temperature of the vapor component heating area 11 was always set higher by 50 [°C.] than the temperature of the substrate heating area 12. There was no remaining bubbles recognized in glass films obtained on the substrates 1. Analysis of element components using EPMA (electron probe micro analyser) showed no element volatilization and no diffusion in an interface area between the core layer and the under cladding layer and in the outermost layer of the core.

Example 2

Using the apparatus of FIG. 1, a glass fine particle deposited film mainly containing $SiO_2$ was formed on Si substrates 1 in the same manner as in Example 1. The deposition conditions of the glass fine particle deposited film were also the same as those in Example 1. Then, glass fine particles deposited on the substrates 1 were heated using a heating oven 20.

Figure 5:
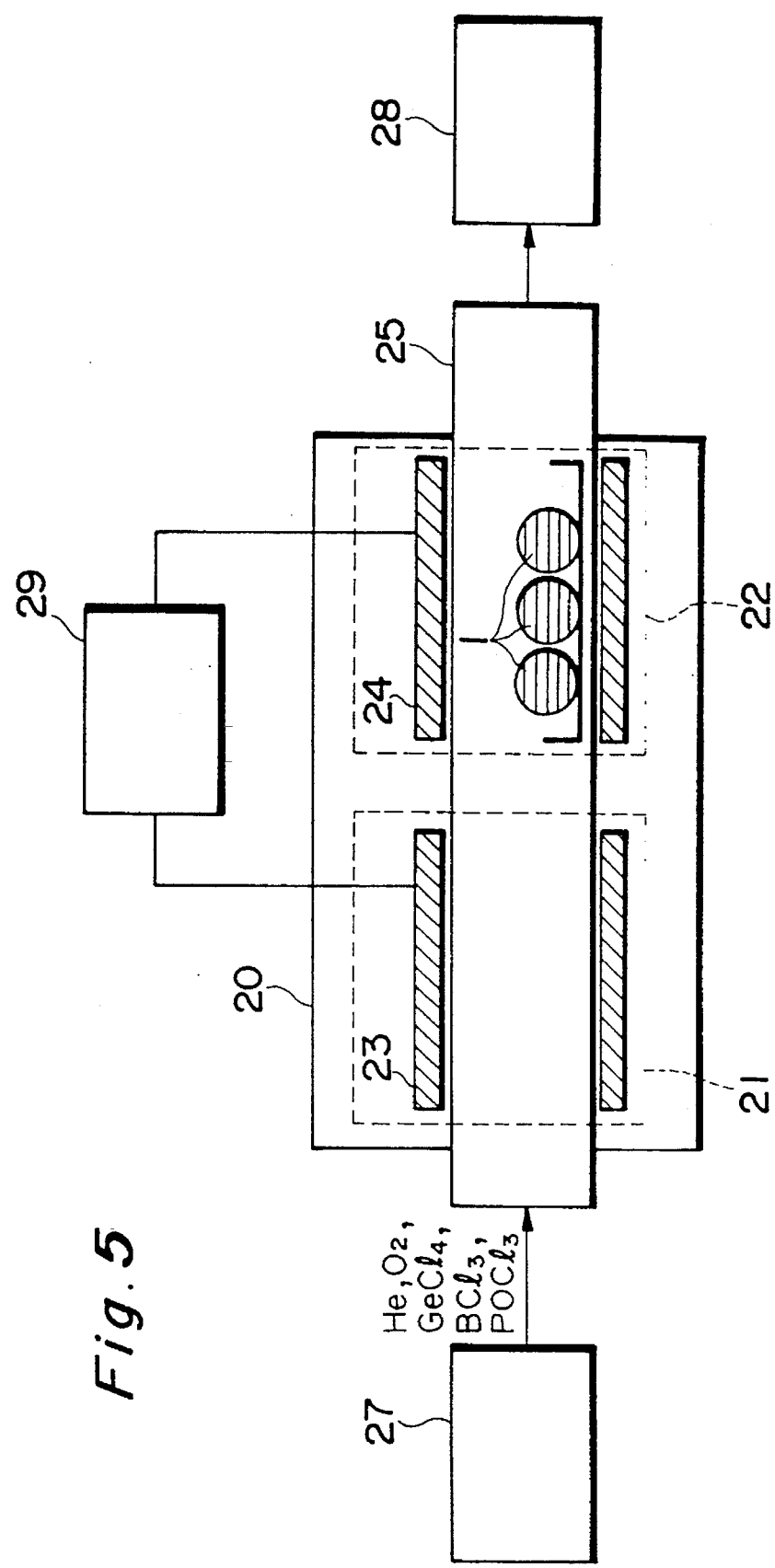
FIG. 5 is a schematic drawing to show an apparatus used in Example 2 according to the present invention.

FIG. 5 shows a schematic construction of an apparatus used in Example 2, which is described in the following. The heating oven 20 is composed of an oven core tube 25, heaters 23, 24, a gas supplying unit 27 for supplying gas into the oven core tube 25, and a gas evacuating unit 28 for evacuating the gas out from the oven core tube 25. The oven core tube 25 is a spatially continuous tube. The oven core tube 25 has an oxidation area 21 located on the upstream side of gas flow and a substrate heating area 22 on the downstream side. These two areas are independently controlled by a control unit 29 to have respective temperatures through the heaters 23, 24, as shown in FIG. 5. The substrates 1 were placed in the substrate heating area 12.

Figure 6:
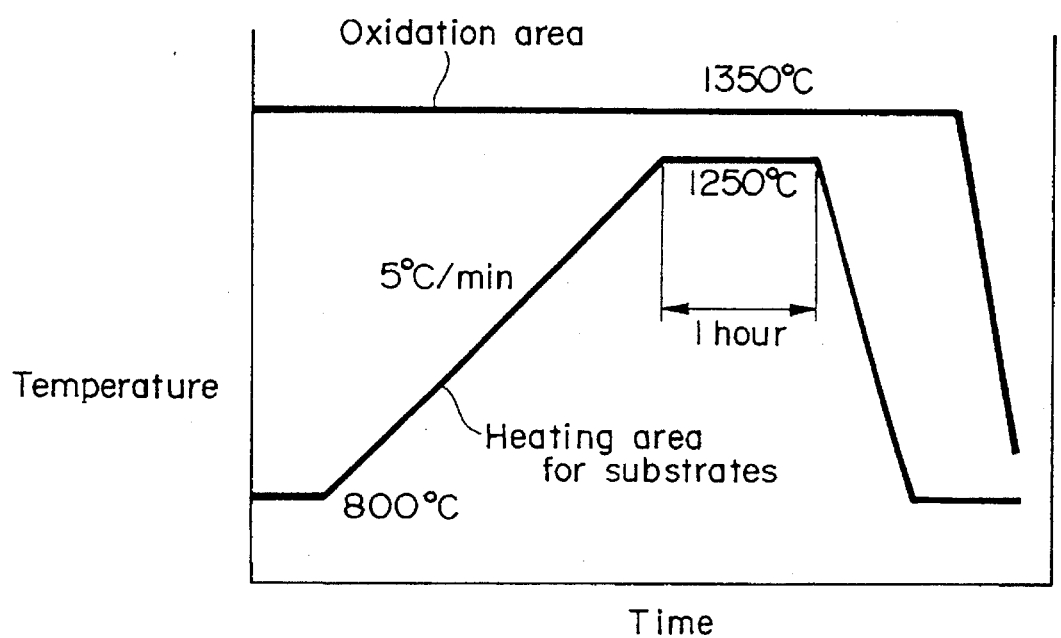
FIG. 6 is a schematic drawing to show a temperature control in Example 2 according to the present invention.

Initially, the temperature of the oxidation area 21 was set at 1350 [°C.] and the temperature of the substrate heating area 22 at 800 [°C.]; and chloride vapor of $GeCl_4$ at 5 [cc/min], $POCl_3$ at 10 [cc/min], and $BCl_3$ at 10 [cc/min], and mixture gas of $O_2$ at 5 [l/min] and He at 5 [l/min] were introduced into the heating oven. The chloride vapor introduced into the heating oven was preliminarily oxidized in the oxidation area 21. Then, the temperature of the substrate heating area 22 was raised at a rate of temperature rise of 5 [°C./min], was then kept at 1250 [°C.] for one hour, and was lowered thereafter down to 800 [°C.], as shown in FIG. 6.

After stopping the supply of the mixture gas, the substrates 1 were taken out. There was no remaining bubbles recognized in glass films on the substrates 1 obtained in this example. Patterning was effected on the films to produce buried waveguides.

Additionally, a glass fine particle deposited layer mainly containing $SiO_2$ was formed on Si substrates 1 under the same deposition conditions as in Example 1. Then, the substrates with the glass fine particle deposited layer were subject to the same heating treatment as in Example 1 without presence of the vapor components ($P_2O_5$, $B_2O_3$, $GeO_2$) by means of the electric oven 10 as shown in FIG. 3. Glass films thus obtained on the substrates 1 had cloudiness on the outermost surfaces thereof. Further, element analysis by EPMA showed that each amount of P, B, and Ge at the outermost surfaces was decreased to be a quarter of each amount inside the films.

The present invention is not limited to the examples as described, but may be applied to a production method and a production apparatus obtained by combination of Example 1 and Example 2.

The introduced oxide vapor of the additive components rarely presented such an influence that the additives diffuse in the surface or in the inside of glass film, but rather showed the great effect of preventing the volatilization of the additive components from the outermost surface of glass film at the high temperature.

The following explains schematic steps to form an optical waveguide, using the production method of the glass thin film according to the present invention, with reference to sectional views as shown in FIGS. 7A to 7F.

Figure 7A:
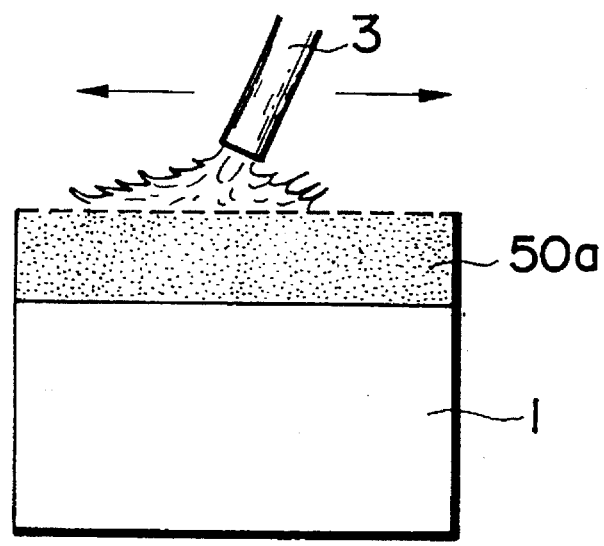
FIGS. 7A–7F are sectional views to respectively show schematic steps of forming an optical waveguide, using a production method of a glass thin film according to the present invention.
Figure 7B:
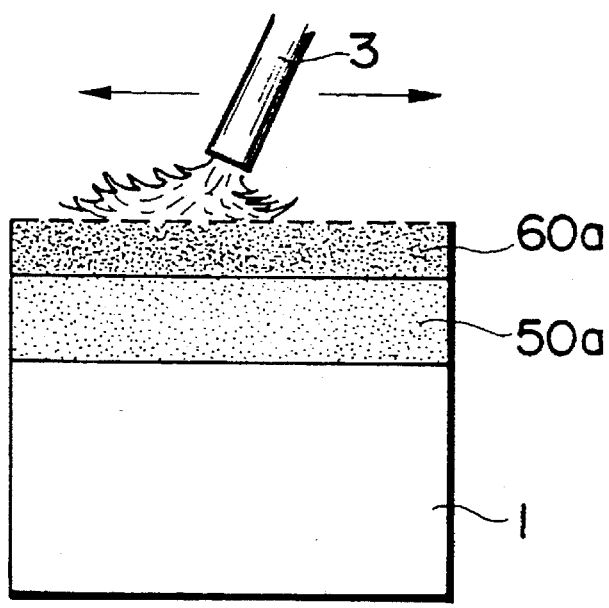

A first porous glass film 50a, which is to become a under cladding layer, is first deposited on a Si substrate 1 (FIG. 7A). A second porous glass film 60a, which is to become a core layer, is then deposited on the first porous glass film 50a (FIG. 7B). The deposition conditions of the first and second porous glass films 50a, 60a are the same as those as shown in Example 1.

Figure 7C:
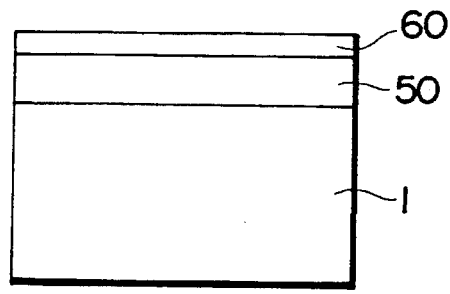
Figure 7D:
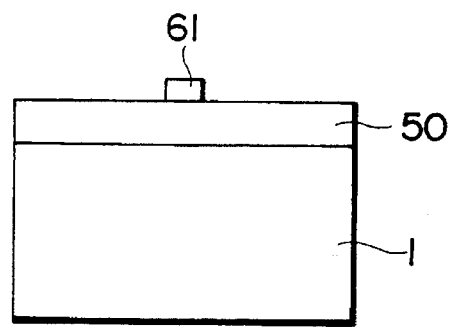

The first and second porous glass films 50a, 60a are heated in a heating oven, into which the oxide vapor is introduced, to form transparent glass layers of a under cladding layer 50 and a core layer 60, respectively (FIG. 7C). The core layer is subject to etching so as to leave a desired region behind, thus forming an optical waveguide 61 (FIG. 7D).

Figure 7E:
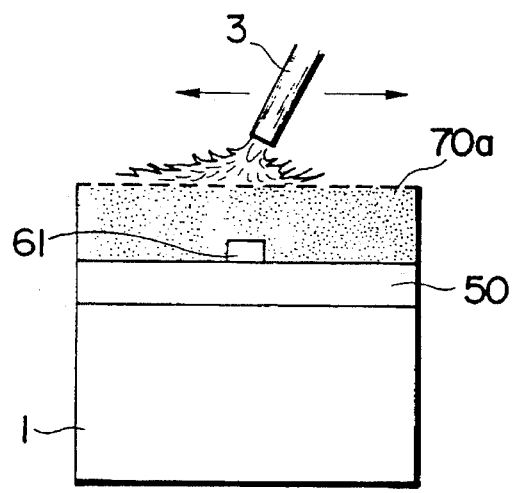
Figure 7F:
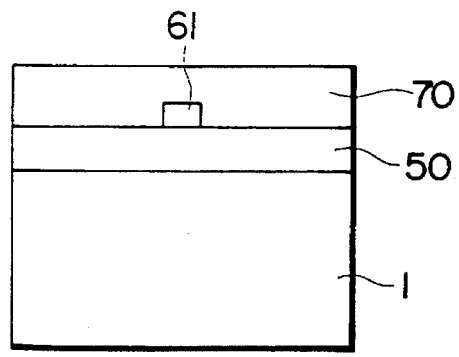

Further, a third porous glass film 70a, which is to become an over cladding layer, is deposited over the under cladding layer 50 and the optical waveguide 61 (FIG. 7E). The deposition conditions of the third porous glass film 70a are the same as those of the first porous glass film 50a, that is, as the first deposition conditions in Example 1. Then, the third porous glass film 70a is heated in the heating oven, into which the oxide vapor is introduced, to form a transparent glass layer of the over cladding layer 70 (FIG. 7F).

An optical loss of the thus produced buried optical waveguide was measured, and the measured loss was not more than 0.1 [dB/cm], which was very good.

Figure 8:
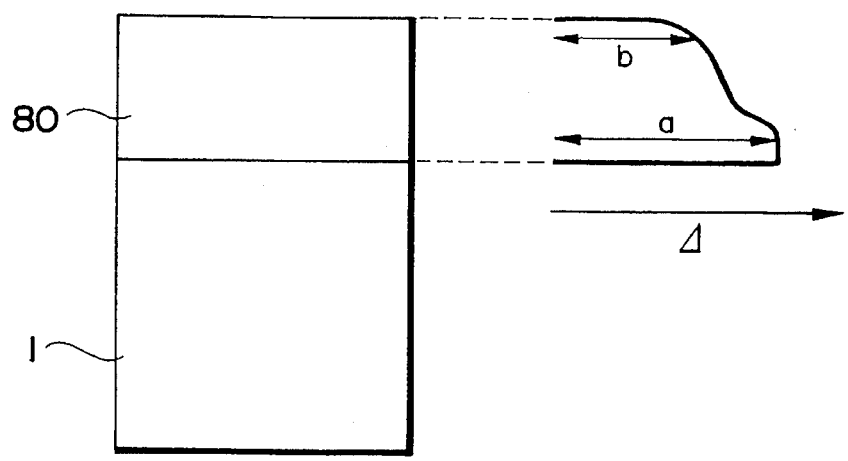
FIG. 8 is a sectional view to illustrate the effect in the present invention.

Final description concerns a relation between the pressure of the introduced oxide vapor and an effect thereof. FIG. 8 is a schematic sectional view to show a glass layer 80, which is obtained by depositing a porous glass film on a substrate 1 and then heating it to form a transparent glass layer. A parameter $\Delta$ at the bottom, or on the substrate side of a glass layer 80 is denoted by a, and a parameter $\Delta$ at the top, or on the surface side of the glass layer 80 by b.

The parameter $\Delta$ is a relative refractive index difference to a silica glass, which is defined by the following equation:

$$\Delta = (n_0^2 - n_1^2)/2n_0^2 \sim (n_0 - n_1)/n_0,$$

where $n_0$ is a refractive index of the silica glass and $n_1$ is a refractive index of an object.

Figure 9:
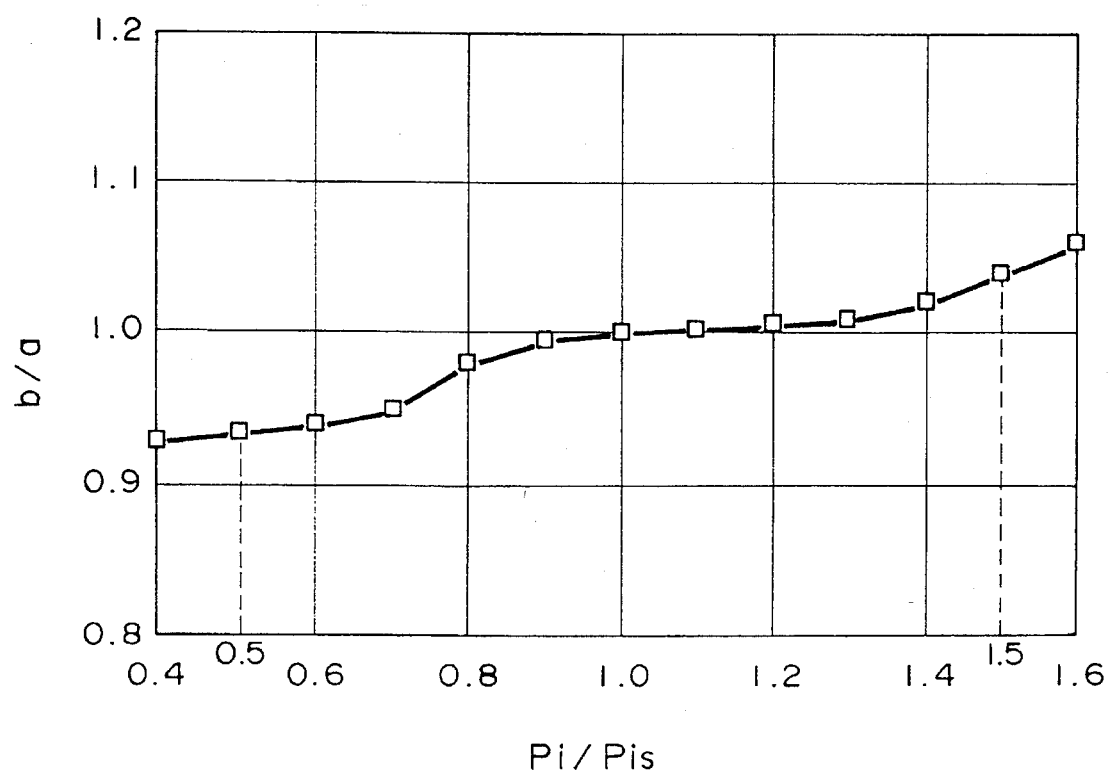
FIG. 9 is a drawing to show a relation between a ratio ($P_i/P_{is}$), which is a ratio of a vapor pressure ($P_i$) of introduced oxides to a saturated vapor pressure ($P_{is}$), and a ratio (b/a), which is a ratio of a parameter $\Delta$ (b) on the surface side to a parameter $\Delta$ (a) on the substrate side.

FIG. 9 shows an example of measurement to check a relation between a ratio ($P_i/P_{is}$), which is a ratio of a pressure ($P_i$) of the introduced oxide vapor to the saturated vapor pressure ($P_{is}$), and a ratio (b/a), which is a ratio of a parameter $\Delta$ (b) of the glass layer 80 on the surface side to a parameter $\Delta$ (a) of the glass layer 80 on the substrate side. This measurement example shows a case with additives of $GeO_2$ and $P_2O_5$, and the similar results are obtained with other additives.

The following briefly explains the graph of FIG. 9. When the pressure ($P_i$) of the introduced oxide vapor is 40 % of the saturated vapor pressure ($P_{is}$), the parameter $\Delta$ (b) on the surface side is about 0.93 times as large as the parameter $\Delta$ (a) on the substrate side, while when the $P_i$ is 160% of $P_{is}$, b is about 1.06 times as large as a. As the pressure ($P_i$) of the introduced oxide vapor increases, the parameter $\Delta$ (b) on the surface side gradually becomes larger.

It is most preferable as waveguide properties that the parameter $\Delta$ (b) on the surface side coincides with the parameter $\Delta$ (a) on the substrate side, which is b/a=1. In order to stabilize the properties of waveguide, it is preferable that the ratio of parameter $\Delta$ (b/a) be set substantially between 0.95 and 1.05. It is accordingly preferable that the pressure ($P_i$) of the introduced oxide vapor be kept at 50 to 150% of the saturated vapor pressure ($P_{is}$).

The silicon substrate was employed as a substrate the above examples, but the substrate may be a silica glass substrate. The present invention can be also applied to cases with various additives which could be volatilized to scatter during heating to form a transparent glass film, in addition to the examples as described above with the additives added to form the porous glass films.

From the invention thus described, it will be obvious that the invention may be varied in many ways. Such variations are not to be regarded as a departure from the spirit and scope of the invention, and all such modifications as would be obvious to one skilled in the art are intended to be included within the scope of the following claims.

What is claimed is:

1. A method for producing a glass thin film with a first additive on a substrate, said method comprising the steps of:
   depositing $SiO_2$ porous glass with the first additive on said substrate;
   heating an oxide of a second additive in a first chamber while controlling a temperature in the first chamber according to a first predetermined temperature profile;
   heating said substrate located in a second chamber communicated with said first chamber to make the deposited porous glass into transparent glass according to a second predetermined profile while controlling a temperature in said second chamber; and
   flowing a carrier gas from said first chamber to said second chamber to transfer said oxide of said second additive in said first chamber to said second chamber during said heating steps,
   wherein the temperature at any given time of said first predetermined temperature profile is higher than the temperature of said second predetermined temperature profile at the same time.

2. A method according to claim 1, wherein said substrate is a silica glass substrate or silicon substrate.

3. A method according to claim 1, wherein said oxide of said second additive comprises at least one of $GeO_x$, $PO_x$ and $BO_x$.

4. A method according to claim 1, wherein the temperature at any given time of said first predetermined temperature profile is higher than the temperature of said second predetermined temperature profile at the same time by at least 50° C.

5. A method according to claim 1, wherein said oxide of said second additive is produced by oxidation of a vapor of a chloride of said second additive with $O_2$.

6. A method according to claim 1, wherein said first additive is the same as said second additive.

7. A method according to claim 6, wherein said substrate is a silica glass substrate or silicon substrate.

8. A method for producing a glass thin film with a first additive on a substrate, said method comprising the steps of:
   depositing $SiO_2$ porous glass with the first additive on said substrate to form a porous glass film thereon; and
   heating said porous glass film formed by said deposition step to form a transparent glass film on said substrate, said heating step comprising the steps of:
      heating an oxide vapor of a second additive in a first chamber while controlling a temperature in the first chamber according to a first predetermined temperature profile; and
      heating said substrate located in a second chamber communicated with said first chamber to make the deposited porous glass into transparent glass according to a second predetermined profile while controlling a temperature in said second chamber and while flowing a carrier gas from said first chamber to said second chamber to transfer said oxide of said second additive in said first chamber to said second chamber,
   wherein the temperature at any given time of said first predetermined temperature profile is higher than the temperature of said second predetermined temperature profile at the same time.

9. A method according to claim 8, wherein said substrate is a silica glass substrate or silicon substrate.

10. A method according to claim 8, wherein said oxide of said second additive comprises at least one of $GeO_x$, $PO_x$ and $BO_x$.

11. A method according to claim 8, wherein the temperature at any given time of said first predetermined temperature profile is higher than the temperature of said second predetermined temperature profile at the same time by at least 50° C.

12. A method according to claim 8, wherein said first additive is the same as said second additive.

13. A method according to claim 12, wherein said substrate is a silica glass substrate or silicon substrate.

* * * * *